United States Patent
Nishida et al.

(10) Patent No.: US 6,850,096 B2
(45) Date of Patent: Feb. 1, 2005

(54) INTERPOLATING SENSE AMPLIFIER CIRCUITS AND METHODS OF OPERATING THE SAME

(76) Inventors: Yoshio Nishida, 3946-C, Marcom St., Raleigh, NC (US) 27606; Wentai Liu, 744-B Nobel Dr., Santa Cruz, CA (US) 95060

(*) Notice: Subject to any disclaimer, the term of this patent is extended or adjusted under 35 U.S.C. 154(b) by 0 days.

(21) Appl. No.: 10/435,076

(22) Filed: May 9, 2003

(65) Prior Publication Data

US 2004/0150465 A1 Aug. 5, 2004

(Under 37 CFR 1.47)

Related U.S. Application Data

(60) Provisional application No. 60/379,691, filed on May 10, 2002.

(51) Int. Cl.$^7$ .............................................. G01R 19/00
(52) U.S. Cl. ......................................... 327/53; 327/56
(58) Field of Search ............................. 327/51–53, 56, 327/66, 72, 77–83, 88–89; 330/257, 288; 365/207; 323/315

(56) References Cited

U.S. PATENT DOCUMENTS 5,528,545 A * 6/1996 Takahashi et al. .......... 365/208
5,856,748 A * 1/1999 Seo et al. ...................... 327/53
6,194,919 B1 * 2/2001 Park ............................ 327/52
6,442,091 B2 * 8/2002 Verbeck ...................... 365/208
6,507,175 B2 * 1/2003 Susak et al. ................ 323/235

* cited by examiner

Primary Examiner—My-Trang Nuton
(74) Attorney, Agent, or Firm—Myers Bigel Sibley & Sajovec

(57) ABSTRACT

A circuit includes a first pre-amp circuit that provides a first pre-amp current and a second pre-amp circuit that provides a second pre-amp current. A first threshold circuit is configured to generate a first output signal responsive to a difference between a variable current and the first pre-amp current. A second threshold circuit is configured to generate a second output signal responsive to a difference between the variable current and the second pre-amp current. One of the branches of a differential interpolation circuit includes a first transistor that is connected in a current mirror configuration with the first pre-amp circuit. The first transistor has a width/length ratio equal to the product nk, where n<1. A second transistor is connected in a current mirror configuration with the second pre-amp circuit. The second transistor has a width/length ratio equal to the product mk, where m<1 and n+m is about 1. The interpolation circuit is configured to generate a third output signal responsive to a difference between the variable current and an interpolated reference current given by n*(first pre-amp current)+m*(second pre-amp current).

12 Claims, 6 Drawing Sheets

INTERPOLATING SENSE AMPLIFIER CIRCUITS AND METHODS OF OPERATING THE SAME

RELATED APPLICATION

This application claims the benefit of and priority to U.S. Provisional Patent Application No. 60/379,691, filed May 10, 2002, the disclosure of which is hereby incorporated herein by reference.

FEDERALLY SPONSORED RESEARCH

The U.S. Government may have certain rights to this invention as provided for by the terms of Contract Number 5-30494 awarded by DARPA.

FIELD OF THE INVENTION

The present invention relates generally to integrated circuit devices, and, more particularly, to sense amplifier devices and methods of operating the same.

BACKGROUND OF THE INVENTION

In general, the demand for lower cost-per-bit, multilevel non-volatile memories has increased in two major application areas: stand-alone systems and embedded systems. For embedded applications, high-speed sensing may he used during read/write memory operations. High speed sensing implementations may use a parallel sensing architecture because it typically involves a single comparison step (see, e.g., FIG. 1, and C. Calligaro et al. "A High-Speed Sensing Scheme for Multi-Level Non-Volatile Memories," in Proc. IEEE Int. Workshop on Memory Technology, Design, and Testing. 1997, pp. 96–99.) As shown in FIG. 1, parallel sensing schemes, however, generally use ($2^n-1$, where n is the number of bits in a memory cell) copies of reference currents (Ir1 through $Ir2^n-1$), pre-amplifiers, and output-stages, which may result in relatively-large area consumption on a chip and/or relatively large power consumption. To avoid these deficiencies, other architectures have been proposed, such as, for example, a serial sensing architecture or a mixed, parallel/serial sensing architecture. Examples of these architectures are discussed in C. Calligaro et al. "A New Serial Sensing Approach for Multistorage," in Proc. IEEE Int. Workshop on Memory Technology, Design, and Testing. 1995, pp. 21–26, and C. Calligaro et al. "Mixed Sensing Architecture for 64-Mbit 16-level-cell Non-Volatile Memories," in Proc. 1996 IEEE Int. Conf. Innovative Systems on Silicon, pp. 133–140.

Nevertheless, both the serial sensing architecture and the mixed, parallel/serial sensing architecture typically use more than two comparison steps because of the serial nature of comparisons. Accordingly, this may lead to a slower operational speed than may be achieved using a parallel sensing architecture.

Current mode techniques may be advantageous for use in providing sensing functionality in multi-level memories. Current-mode circuitry may be particularly useful for providing relatively high-speed sensing functionality with a low-voltage power supply. (See, e.g., E. Seevinck et al. "Current-Mode Techniques for High-Speed VLSI Circuits with Application to Current Sense Amplifier for CMOS SRAMs," in IEEE J. of SSC, Vol. 26, Apr. 1991, pp. 525–535.) Current-mode sensing circuits have been used in multi-level non-volatile sense amplifiers as described, for example, in C. Calligaro et al. "A High-Speed Sensing Scheme for Multi-Level Non-Volatile Memories," in Proc. IEEE Int. Workshop on Memory Technology, Design, and Testing. 1997, pp. 96–99, E. Seevinck et al. "Current-Mode Techniques for High-Speed VLSI Circuits with Application to Current Sense Amplifier for CMOS SRAMs," in IEEE J. of SSC, Vol. 26, Apr. 1991, pp. 525–535, and P.Y. Chee et al. "High-Speed Hybrid Current-Mode Sense Amplifier for CMOS SRAMs," in Electron Letters, Apr. 23, 1992, Vol. 28, No. 9, pp. 871–873.

SUMMARY OF THE INVENTION

According to some embodiments of the present invention, a circuit comprises a first pre-amp circuit that provides a first pre-amp current and a second pre-amp circuit that provides a second pre-amp current. A first threshold circuit is configured to generate a first output signal responsive to a difference between a variable current and the first pre-amp current. A second threshold circuit is configured to generate a second output signal responsive to a difference between the variable current and the second pre-amp current. One of the branches of a differential interpolation circuit comprises a first transistor that is connected in a current mirror configuration with the first pre-amp circuit. The first transistor has a width/length ratio equal to the product nk, where n<1 and k is an arbitrary number. A second transistor is connected in a current mirror configuration with the second pre-amp circuit. The second transistor has a width/length ratio equal to the product mk, where m<1 and n+m is about 1. The interpolation circuit is configured to generate a third output signal responsive to a difference between the variable current and an interpolated reference current given by n * (first pre-amp current)+m * (second pre-amp current).

In further embodiments of the present invention, first, second, and third detection circuits are connected to the first threshold circuit, second threshold circuit, and interpolation circuit, respectively, and are responsive to the first, second, and third output signals, respectively.

In still further embodiments of the present invention, the interpolation circuit further comprises third and fourth transistors that are connected in a current mirror configuration with at least one of the first and second pre-amp circuits.

In still further embodiments of the present invention, the first transistor, second transistor, third transistor and fourth transistor are NMOS transistors, and the interpolation circuit further comprises a fifth PMOS transistor having a drain terminal connected to a gate terminal. The drain terminal is further connected to drain terminals of the third and fourth transistors. The interpolation circuit further comprises a sixth PMOS transistor having a gate terminal connected to the gate terminal of the fifth PMOS transistor and a drain terminal connected to drain terminals of the first and second transistors.

Although described above primarily with respect to circuit embodiments of the present invention, it will be understood that the present invention may also be embodied as methods of operating a circuit.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 2:
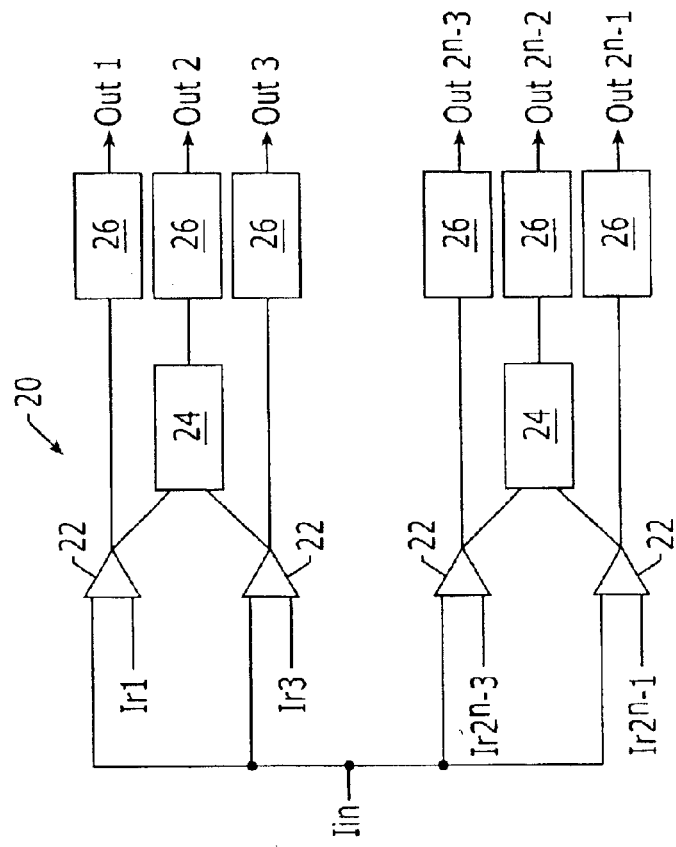
FIG. 2 is a block diagram that illustrates interpolating sense amplifier circuits and methods of operating the same in accordance with some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 1:
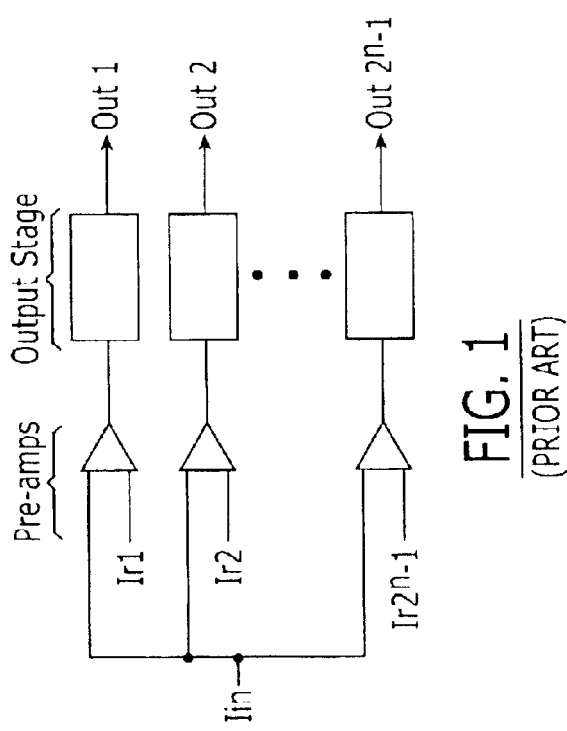
FIG. 1 is a block diagram that illustrates a conventional parallel sensing architecture.

According to some embodiments of the present invention, sense amplifier circuits use signal interpolation, which may provide relatively high-speed operation, without consuming excessive chip area or dissipating excessive amounts of power. FIG. 2 is a block diagram that illustrates interpolating sense amplifier circuits and methods of operating the same in accordance with some embodiments of the present invention. As shown in FIG. 2, a sense amplifier circuit 20 comprises a plurality of pre-amp circuits 22, a plurality of interpolator circuits 24, and a plurality of output circuits 26. Only one interpolator circuit 24 for each pair of reference signals (Ir1 through $Ir2^n-1$) is shown in FIG. 2; however, additional interpolated reference signals may be generated based on existing reference signals from the pre-amp stage for comparison with an input signal by using more interpolators. Compared with a conventional parallel sensing architecture shown in FIG. 1, sense amplifier circuits, in accordance with some embodiments of the present invention, may maintain ($2^n-1$) output levels while reducing the number of pre-amps and pre-amp reference signals.

Figure 3:
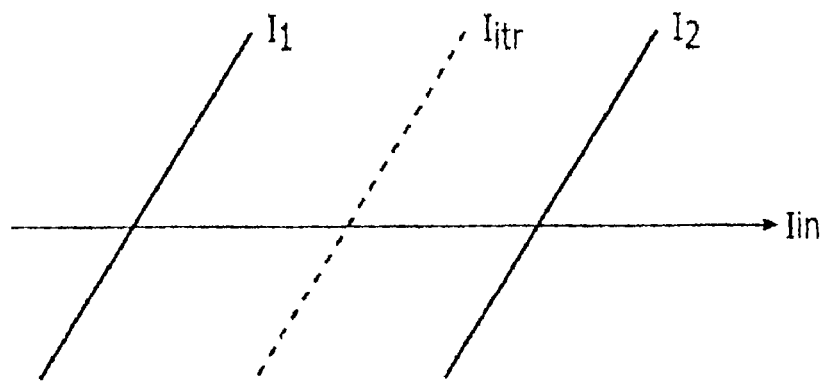
FIGS. 3 and 4 are graphs that conceptually illustrate interpolating sense amplifiers and methods of operating the same, in accordance with some embodiments of the present invention.
Figure 4:
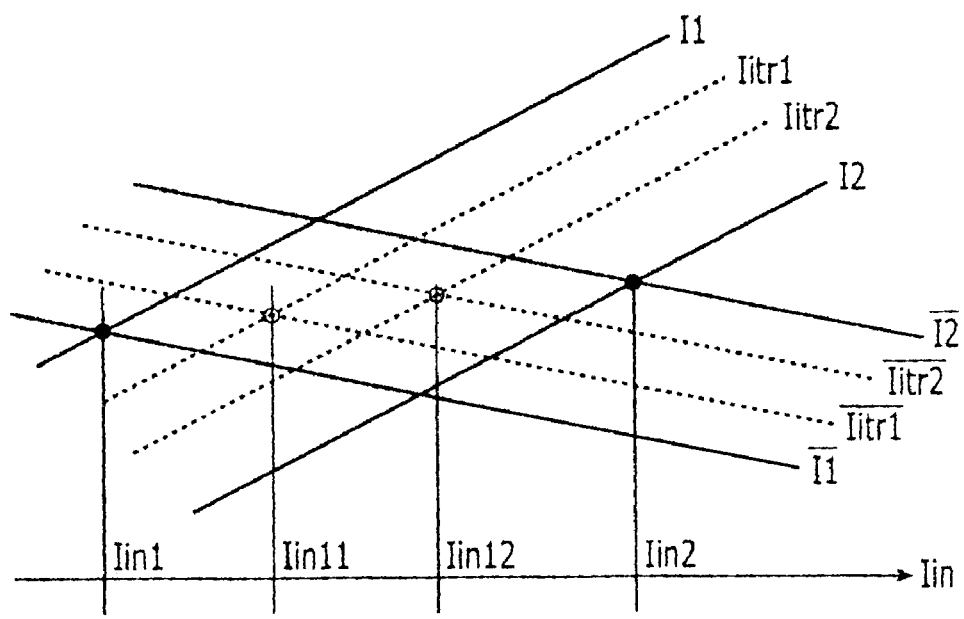

FIGS. 3 and 4 are graphs that conceptually illustrate interpolating sense amplifiers and methods of operating the same, in accordance with some embodiments of the present invention. Referring now to FIG. 3, an interpolated reference signal litr may be generated by summing the halves of reference signals I1 and I2, which may be provided at the pre-amp stage. The three signals I1, litr, and I2 may then be used to compare with an input signal Iin. Referring now to FIG. 4, multiple interpolated reference signals, i.e., litr1 and litr2, may be generated by summing fractions of the reference signals I1 and I2, where $litr1 = \frac{2}{3}I1 + \frac{1}{3}I2$ and $litr2 + \frac{1}{3}I1 + \frac{2}{3}I2$. Embodiments in which multiple interpolated reference signals are derived from a pair of reference signals may be referred to as differential interpolating architectures. Thus, with the four reference signals—I1, I2, litr1, and litr2—four compared outputs can be created.

Figure 5A:
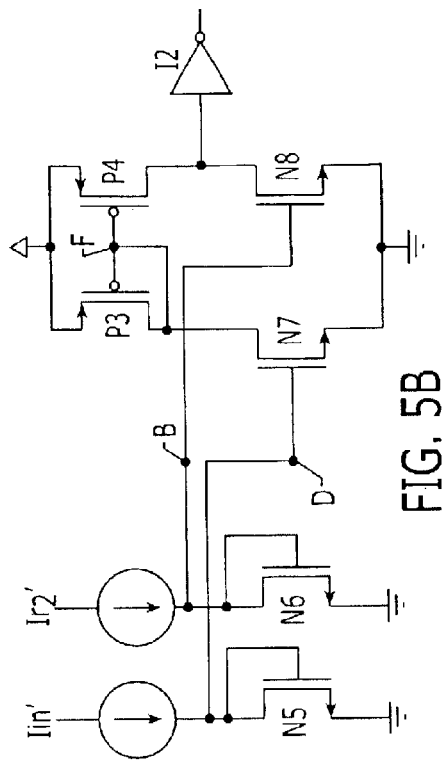
FIGS. 5A and 5B are circuit schematics that illustrate pre-amp and threshold circuits that may be used in interpolating sense amplifiers, in accordance with some embodiments of the present invention.
Figure 5B:
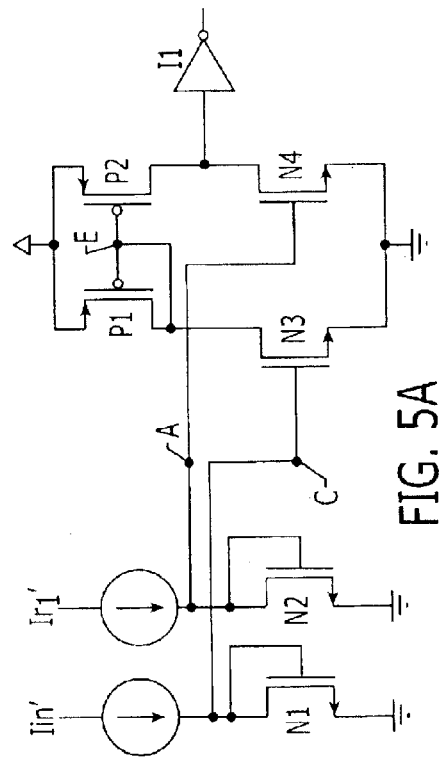

FIGS. 5A and 5B are circuit schematics that illustrate pre-amp and threshold circuits that may be used in interpolating sense amplifiers, in accordance with some embodiments of the present invention. As shown in FIG. 5A, a pre-amp circuit comprises two transistors N1 and N2 that are configured as shown and that generate an output current Iin' and an output reference current Ir1' responsive to respective input currents. A threshold circuit comprises four transistors P1, P2, N3, and N4 that are configured as shown. The threshold circuit is coupled to an inverter I1, which is used as an output circuit or output stage. Similarly, FIG. 5B, illustrates a pre-amp circuit that comprises two transistors N5 and N6 that are configured as shown and that generate an output current Iin and an output reference current Ir2' responsive to respective input currents. A threshold circuit comprises four transistors P3, P4, N7, and N8 that are configured as shown. The threshold circuit is coupled to an inverter I2, which is used as an output circuit or output stage. The NMOS transistors N1, N2, N3, N4, N5, N6, N7, and N8, have a same width/length ratio, which is given by k. The PMOS transistors P1, P2, P3, and P4 have a same width/length ratio, which is given by k'. The circuits of FIGS. 5A and 5B may be used to generate output signals based on a comparison of the current Iin' with the reference currents Ir1' and Ir2', respectively.

Figure 6:
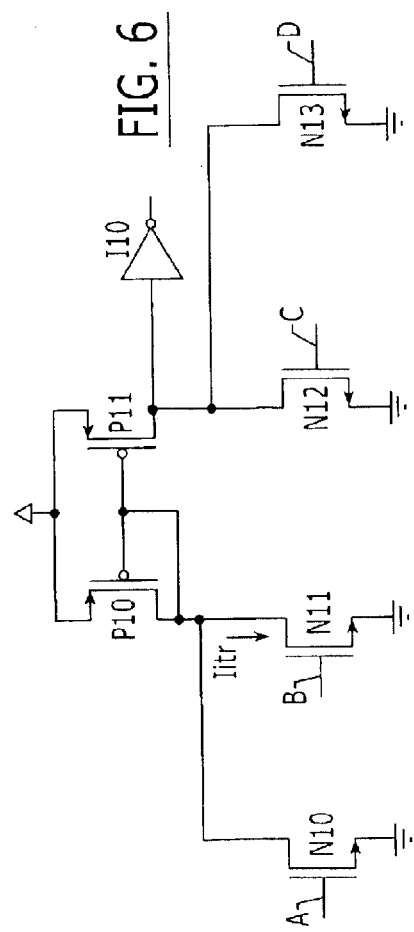
FIG. 6 illustrates an interpolation circuit that may be used as a threshold circuit in accordance with some embodiments of the present invention.

FIG. 6 illustrates an interpolation circuit that may be used as a threshold circuit in accordance with some embodiments of the present invention. As shown in FIG. 6, an interpolation circuit comprises transistors N10, N11, N12, N13, P10, and P11, which are configured as shown. The threshold circuit is coupled to an inverter I10, which is used as an output circuit or output stage. The gate terminals of the transistors N10, N11, N12, and N13 are coupled to the nodes indicated on the pre-amp circuits of FIGS. 5A and 5B. As discussed above, the transistors N1, N2, N5, and N6 have a width/length ratio of k. In FIG. 6, however, transistor N10 has a width/length ratio of $\frac{2}{3}k$, transistor N11 has a width/length ratio of $\frac{1}{3}k$, transistor N12 has a width/length ratio of $\frac{2}{3}k$, and transistor N13 has a width/length ratio of $\frac{1}{3}k$. Transistors N10 and N11 are configured in a current-mirror configuration with transistors N1 and N5, respectively, from FIGS. 5A and 5B. Transistors N12 and N13 are configured in a current-mirror configuration with transistors N2 and N6, respectively, from the FIGS. 5A and 5B. Because the transistors N12 and N13 have width/length ratios of $\frac{2}{3}k$ and $\frac{1}{3}k$, respectively, they may provide an interpolated reference current $litr1 = \frac{2}{3}Ir1' + \frac{1}{3}Ir2'$. Thus, the interpolation circuit is configured to generate an output signal responsive to a difference between a variable current and an interpolated reference current given by n * (first pre-amp current)+m * (second pre-amp current), where n+m is about 1 in some embodiments and equal to 1 in particular embodiments.

Figure 7:
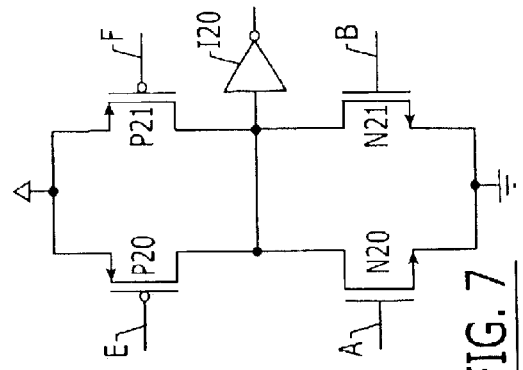
FIG. 7 illustrates an interpolation circuit in accordance with some other embodiments of the present invention that comprises fewer transistors than the interpolation circuit of FIG. 6.

FIG. 7 illustrates an interpolation circuit in accordance with some other embodiments of the present invention that comprises fewer transistors than the interpolation circuit of FIG. 6. As shown in FIG. 7, the interpolation circuit comprises transistors P20, P21, N20, and N21, which are configured as shown. The threshold circuit is coupled to an inverter I20, which is used as an output circuit or output stage. The gate terminals of the transistors P20, P21, N20, and N21 are coupled to the nodes indicated on the pre-amp circuits of FIGS. 5A and 5B. Transistor P20 has a width/length ratio of ⅔k', transistor P21 has a width/length ratio of ⅓k', transistor N20 has a width/length ratio of ⅔k, and transistor N21 has a width/length ratio of ⅓k.

Figure 8:
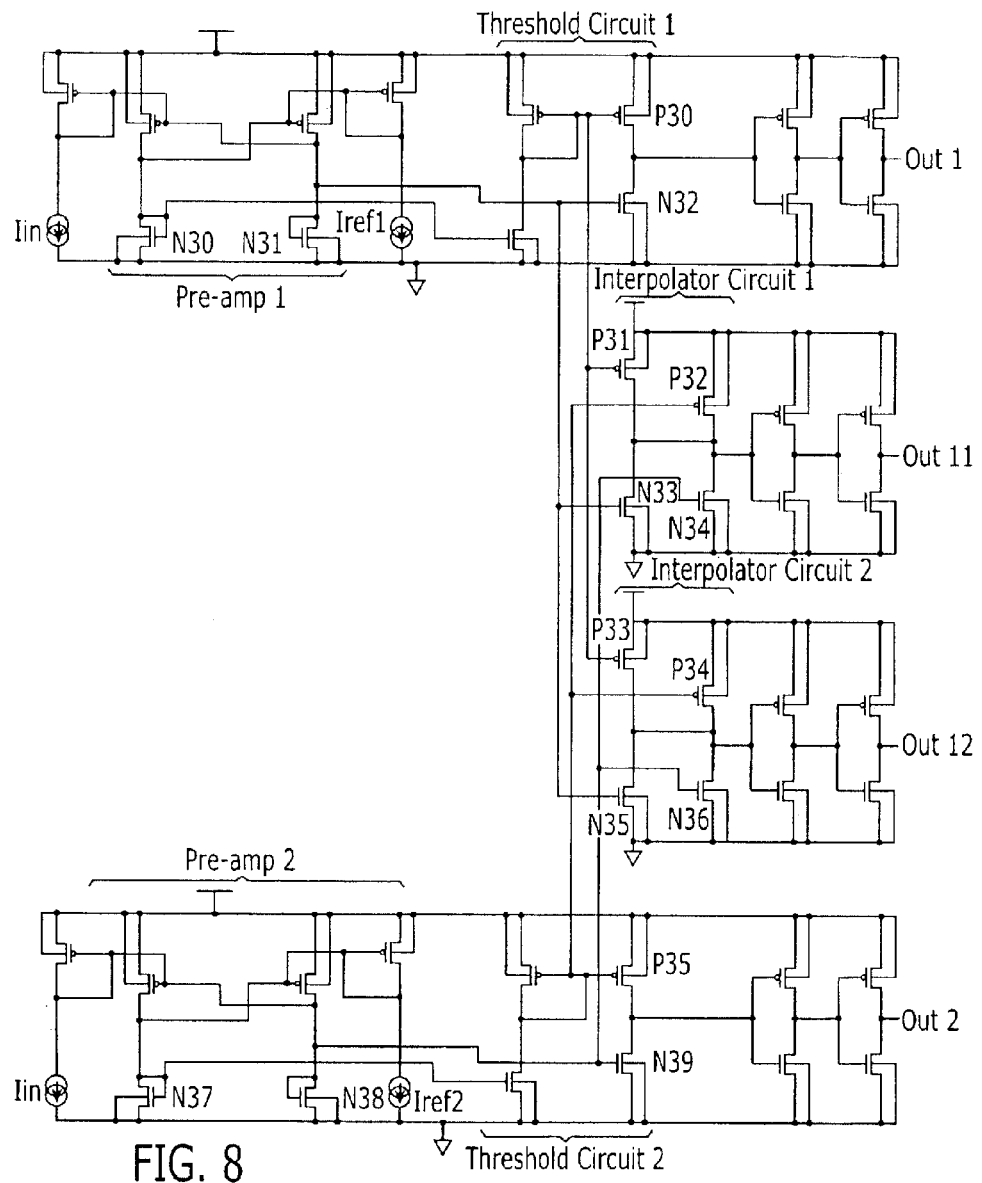
FIG. 8 is a circuit schematic that illustrates interpolating sense amplifiers and methods of operating the same, in accordance with some embodiments of the present invention, in which two interpolator circuits are used.
Figure 9A:
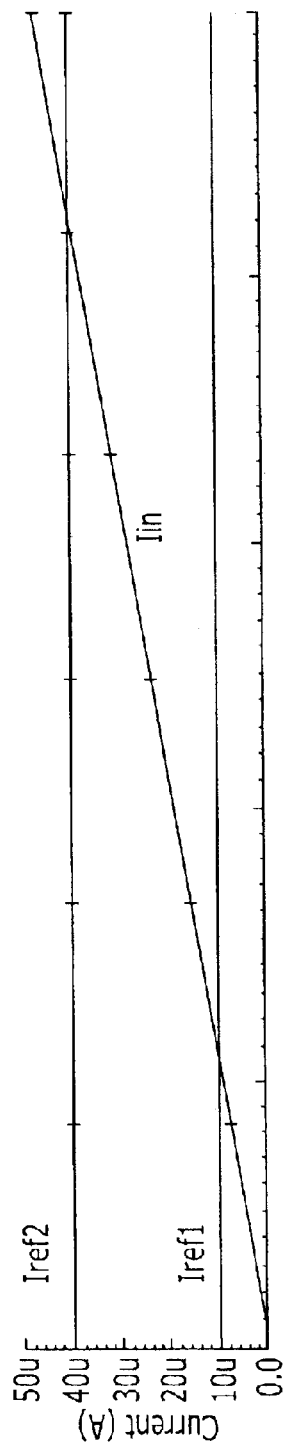
FIGS. 9A, 9B, and 9C illustrate operations of interpolating sense amplifiers and methods of operating the same in which four outputs are obtained from two reference currents by sweeping an input current across a range spanning the reference current values.
Figure 9B:
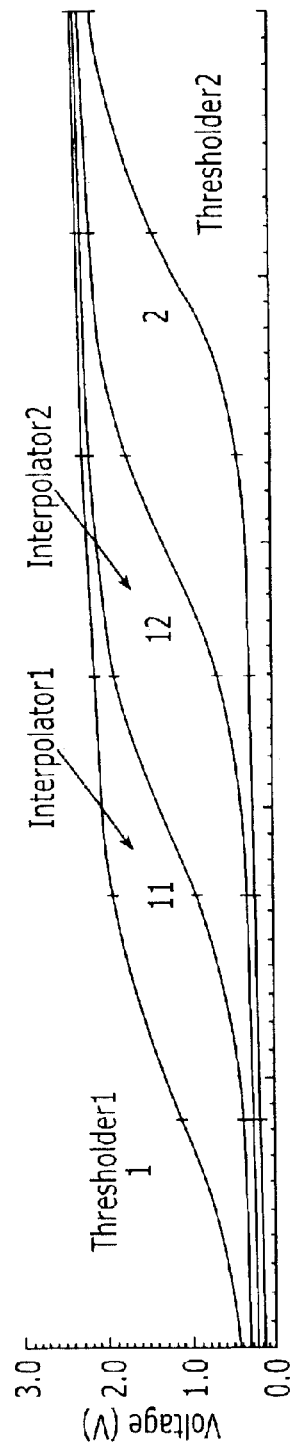
Figure 9C:
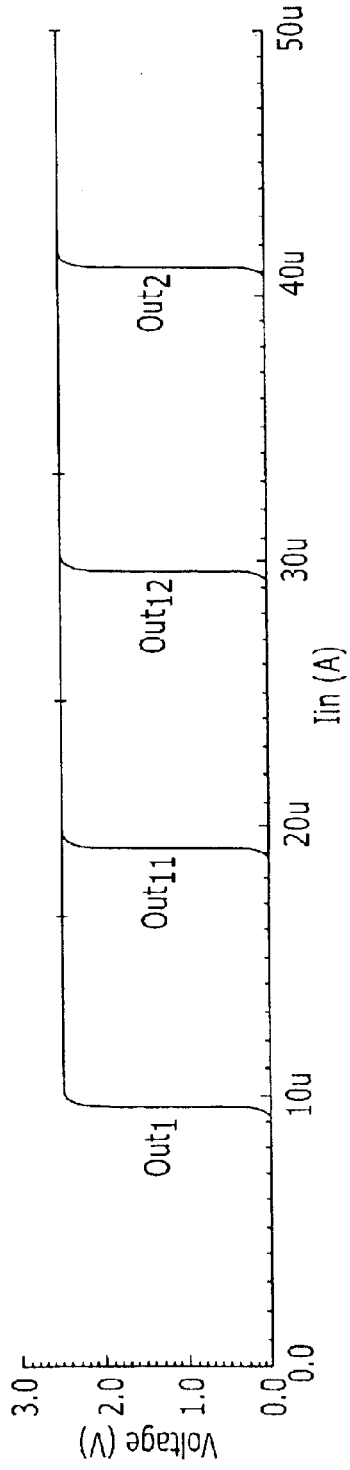

FIG. 8 is a circuit schematic that illustrates interpolating sense amplifiers and methods of operating the same, in accordance with some embodiments of the present invention, in which two interpolator circuits are used. FIGS. 9A, 9B, and 9C are a SPICE simulation of the circuit shown in FIG. 8. Referring now to FIG. 8, there are two pre-amplifier circuits 1 and 2, two threshold circuits 1 and 2, and two interpolator circuits 1 and 2. The configuration of a current-mode pre-amp and a differential to single-end amp threshold circuit is commonly used for parallel sensing. Four of these types of circuits are commonly used in conventional sense amplifier circuits for four level sensing as described, for example, in C. Calligaro et al. "A High-Speed Sensing Scheme for Multi-Level Non-Volatile Memories," in Proc. IEEE Int. Workshop on Memory Technology, Design, and Testing. 1997, pp. 96–99 and E. Seevinck et al. "Current-Mode Techniques for High-Speed VLSI Circuits with Application to Current Sense Amplifier for CMOS SRAMs," in IEEE J. of SSC, Vol. 26, Apr. 1991, pp. 525–535, the disclosures of which are hereby incorporated herein by reference. Advantageously, by using current-mode interpolation as described above, only two of these types of circuits may be used to create four outputs, in accordance with some embodiments of the present invention. As shown in FIG. 8, four level sensing can be provided by using two pairs of current sources, sinks, and inverters.

NMOS transistors N30, N31, N37, N38, N32, and N39 have a width/length ratio given by k. PMOS transistors P30 and P35 have a width/length ratio given by k'. Transistor P31 has a width/length ratio of ⅔k', transistor N33 has a width/length ratio of ⅔k, transistor P33 has a width/length ratio of ⅓k', transistor N35 has a width/length ratio of ⅓k, transistor P32 has a width/length ratio of ⅓k', transistor N34 has a width/length ratio of ⅓k, transistor P34 has a width/length ratio of ⅔k', and transistor N36 has a width/length ratio of ⅔k. FIG. 9A is a graph of the input current Iin being varied so as to cross the two reference current values Iref1 and Iref2. FIG. 9B is a graph of the output voltage levels at the threshold circuit 1, the interpolator circuit 1, the interpolator circuit 2, and the threshold circuit 2. FIG. 9C is a graph of the output voltage levels labeled in FIG. 8.

FIGS. 9A, 9B, and 9C illustrate operations of interpolating sense amplifiers and methods of operating the same in which four outputs are obtained from two reference currents by sweeping an input current across a range spanning the reference current values. Two differential-single outputs and two outputs based on interpolated referenced currents can be obtained at a low-voltaic power supply of about 2.5 volts. Four digital outputs may be generated via inverters.

Figure 10:
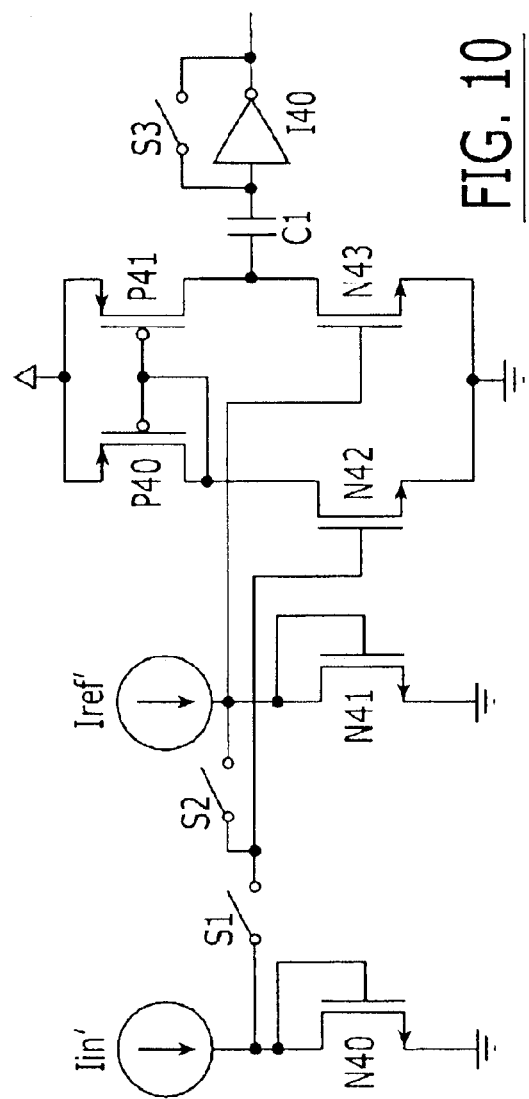
FIG. 10 is a circuit schematic that illustrates pre-amp and threshold circuits that may be used in interpolating sense amplifiers, in accordance with some embodiments of the present invention.

FIG. 10 is a circuit schematic that illustrates pre-amp and threshold circuits that may be used in interpolating sense amplifiers, in accordance with some embodiments of the present invention. As shown in FIG. 10, a pre-amp circuit comprises two transistors N40 and N41 that are configured as shown and that generate an output current Iin' and an output reference current Ir1' responsive to respective input currents. A threshold circuit comprises four transistors P40, P41, N42, and N43 that are configured as shown. The threshold circuit is coupled to an inverter I40, which is used as an output circuit or output stage. Three switches S1, S2, and S3 are also configured as shown. To obtain a reference level for the threshold circuit, switch S1 may be opened and switches S2 and S3 may be closed so that the threshold circuit is driven solely by the reference current Iref. In this way, a "zero" or baseline level may be determined as a reference level on the capacitor C1. During normal operation, switch S1 may be closed and switches S2 and S3 may be opened.

In concluding the detailed description, it should be noted that many variations and modifications can be made to the preferred embodiments without substantially departing from the principles of the present invention, All such variations and modifications are intended to be included herein within the scope of the present invention. It will be understood that the scope of the present invention is not limited by the claims, but is intended to encompass the present disclosure, including structural and functional equivalents thereof

We claim:

1. A circuit, comprising:
    a first transistor that provides a first reference current;
    a second transistor that provides a second reference current, the first and second transistors each having a width/length ratio represented by k;
    an interpolation circuit that comprises:
        a third transistor that is connected in a current mirror configuration with the first transistor, the third transistor having a width/length ratio equal to the product nk, where n<1; and
        a fourth transistor that is connected in a current mirror configuration with the second transistor, the fourth transistor having a width/length ratio equal to the product mk, where m<1 and n+m is about 1, the interpolation circuit being configured to generate an output signal responsive to a difference between a variable current and an interpolated reference current given by n*(first reference current)+m *(second reference current).

2. The circuit of claim 1, further comprising:
    a detection circuit connected to the interpolation circuit and being responsive to the output signal.

3. The circuit of claim 1, further comprising at least one transistor that provides the input current, the interpolation circuit further comprising:
    fifth and sixth transistors that are connected in a current mirror configuration with the at least one transistor that provides the input current.

4. The circuit of claim 3, wherein the third transistor, fourth transistor, fifth transistor and sixth transistor are NMOS transistors, and wherein the interpolation circuit further comprises:
    a seventh PMOS transistor having a drain terminal connected to a gate terminal, the drain terminal being connected to drain terminals of the fifth and sixth transistors;
    an eighth PMOS transistor having a gate terminal connected to the gate terminal of the seventh PMOS transistor and a drain terminal connected to drain terminals of the third and fourth transistors.

5. The circuit of claim 1, wherein the third and fourth transistors are NMOS transistors having their respective drain terminals connected to each other and their respective source terminals connected to each other, and wherein the interpolation circuit further comprises:

fifth and sixth PMOS transistors having their respective drain terminals connected to each other and their respective source terminals connected to each other, the drain terminals of the third and fourth NMOS transistors being connected to the drain terminals of the fifth and sixth PMOS transistors.

6. A circuit, comprising:

a first pre-amp circuit that provides a first pre-amp current;

a second pre-amp circuit that provides a second pre-amp current;

a first threshold circuit that is configured to generate a first output signal responsive to a difference between a variable current and the first pre-amp current;

a second threshold circuit that is configured to generate a second output signal responsive to a difference between the variable current and the second pre-amp current;

an interpolation circuit that comprises:

a first transistor that is connected in a current mirror configuration with the first pre-amp circuit, the first transistor having a width/length ratio equal to the product nk, where n<1;

a second transistor that is connected in a current mirror configuration with the second pre-amp circuit, the second transistor having a width/length ratio equal to the product mk, where m<1 and n+m is about 1, the interpolation circuit being configured to generate a third output signal responsive to a difference between the variable current and an interpolated reference current given by n * (first pre-amp current)+m*(second pre-amp current).

7. The circuit of claim 6, further comprising:

first, second, and third detection circuits connected to the first threshold circuit, second threshold circuit, and interpolation circuit, respectively, and being responsive to the first, second, and third output signals, respectively.

8. The circuit of claim 6, wherein the interpolation circuit further comprises:

third and fourth transistors that are connected in a current mirror configuration with the at least one of the first and second pre-amp circuits.

9. The circuit of claim 8, wherein the first transistor, second transistor, third transistor and fourth transistor are NMOS transistors, and wherein the interpolation circuit further comprises:

a fifth PMOS transistor having a drain terminal connected to a gate terminal, the drain terminal being connected to d rain terminals of the third and fourth transistors;

an sixth PMOS transistor having a gate terminal connected to the gate terminal of the fifth PMOS transistor and a drain terminal connected to drain terminals of the first and second transistors.

10. A method of operating a circuit, comprising:

generating a first reference current using a first transistor;

generating a second reference current using a second transistor, the first and second transistors having a width/length ratio represented by k;

mirroring the first reference current using a third transistor having a width/length ratio equal to the product nk, where n<1;

mirroring the second reference current using a fourth transistor having a width/length ratio equal to the product mk, where m<1 and n+m is about 1; and detecting a difference between a variable current and an interpolated reference current given by n*(first reference current)+m*(second reference current).

11. A method of operating a circuit, comprising:

generating a variable current;

generating a first reference current using a first pre-amp circuit;

generating a second reference current using a second pre-amp circuit;

generating a first output signal using a first threshold circuit responsive to a difference between the variable current and the first reference current;

generating a second output signal using a second threshold circuit responsive to a difference between the variable current and the second reference current;

mirroring the first reference current using a first transistor having a width/length ratio equal to the product nk, where n<1;

mirroring the second reference current using a second transistor having a width/length ratio equal to the product mk, where m<1 and n+m is about 1; and generating a third output signal responsive to a difference between the variable current and an interpolated reference current given by n*(first reference current)+m *(second reference current).

12. The method of claim 11, wherein the first threshold circuit comprises two input terminals, the method further comprising:

applying the first reference current to the two input terminals of the first threshold circuit to generate a baseline output signal in response thereto.

* * * * *